United States Patent
Baek

[11] Patent Number: 6,138,262
[45] Date of Patent: Oct. 24, 2000

[54] MEMORY ADDRESS GENERATOR IN CONVOLUTIONAL INTERLEAVER/DEINTERLEAVER

[75] Inventor: Jong Seob Baek, Kyoungki-do, Rep. of Korea

[73] Assignee: Hyundai Electronics Industries Co., Ltd., Ichon, Rep. of Korea

[21] Appl. No.: 09/083,192

[22] Filed: May 22, 1998

[30] Foreign Application Priority Data

May 23, 1997 [KR] Rep. of Korea ......................97-20474

[51] Int. Cl.$^7$ .................................................. G11C 29/00
[52] U.S. Cl. ........................................ 714/768; 714/786
[58] Field of Search ................................. 711/157, 217; 712/36; 375/295; 714/701, 786, 768

[56] References Cited

U.S. PATENT DOCUMENTS

| | | | |
|---|---|---|---|
| 5,398,322 | 3/1995 | Marwood | 711/217 |
| 5,537,420 | 7/1996 | Huang | 714/701 |
| 5,572,532 | 11/1996 | Fimoff et al. | 37/22 |
| 5,612,974 | 3/1997 | Astrachan | 375/295 |
| 5,708,842 | 1/1998 | Ikegaya et al. | 712/36 |
| 5,912,868 | 6/1999 | Khoury | 714/701 |
| 5,940,863 | 8/1999 | Fimoff et al. | 711/157 |

Primary Examiner—Albert De Cady
Assistant Examiner—David Ton
Attorney, Agent, or Firm—Jacobson, Price, Holman & Stern, PLLC

[57] ABSTRACT

A memory address generator in a convolutional interleaver/deinterleaver for correcting errors occurred in a data transmission of communication systems. The memory address generator includes: a first counter for counting a first variable (y) representing a location of one of total rows in a memory of the convolutional interleaver/deinterleaver, in response to a clock signal; a second counter for counting a second variable (z) representing a location of one of total columns in the memory of the convolutional interleaver/deinterleaver; a third counter for counting a third variable (x) representing a location of the memory address in an unit memory cell having a plurality of a memory address; an offset value generator for generating an offset value of the first variable in response to the first variable; a first adder for adding the second variable outputted from the second counter to the third variable outputted from the third counter; and a second adder for adding the added value from the first adder to the offset value of the first variable outputted from the offset value generator and outputting the memory address of the convolutinal interleaver/deinterleaver.

5 Claims, 3 Drawing Sheets

<INTERLEAVER>     <DEINTERLEAVER>

| ROW | RANGE OF MEMORY ADDRESS |
|---|---|
| A | 0~186 |
| B | 187~356 |
| C | 357~509 |
| D | 510~645 |
| E | 646~764 |
| F | 765~866 |
| G | 867~951 |
| H | 952~1019 |
| I | 1020~1070 |
| J | 1071~1104 |
| K | 1105~1122 |
| L | NO DELAY |

FIG. 5

| y | OFFSET(y) |
|---|---|
| 0 | 0 |
| 1 | 187 |
| 2 | 357 |
| 3 | 510 |
| 4 | 646 |
| 5 | 765 |
| 6 | 867 |
| 7 | 952 |
| 8 | 1020 |
| 9 | 1071 |
| 10 | 1105 |
| 11 | x |

FIG. 6

| y | x | z | OFFSET(y) | MEMORY ADDRESS |
|---|---|---|---|---|
| 0 | 0 | 0 | 0 | 0 |
| 1 | 0 | 0 | 187 | 187 |
| ⋮ | ⋮ | ⋮ | ⋮ | ⋮ |
| 10 | 0 | 0 | 1105 | 1105 |
| 11 | ⋮ | ⋮ | ⋮ | x |
| 0 | 1 | 0 | 0 | 1 |
| 1 | 1 | 0 | 187 | 188 |
| ⋮ | ⋮ | ⋮ | ⋮ | ⋮ |
| 9 | 0 | 1 | 1071 | 1088 |
| 10 | 0 | 0 | 1105 | 1105 |
| ⋮ | ⋮ | ⋮ | ⋮ | ⋮ |
| 0 | 16 | 10 | 0 | 186 |
| ⋮ | ⋮ | ⋮ | ⋮ | ⋮ |
| ⋮ | ⋮ | ⋮ | ⋮ | ⋮ |

MEMORY ADDRESS GENERATOR IN CONVOLUTIONAL INTERLEAVER/DEINTERLEAVER

BACKGROUND OF THE INVENTION

1. Field of the Invention

The present invention relates to a convolutional interleaver/deinterleaver for correcting errors occurred in a data transmission of communication systems, and more particularly to a memory address generator in the convolutional interleaver/deinterleaver.

2. Description of Related Art

Generally, for correcting burst errors which may occur in the data transmission of the communication systems, an encoding part in the system has the interleaver and a decoding part has the deinterleaver. The interleaver and the deinterleaver delay a data for a predetermined length respectively and output the data after adjusting an order of the data using a memory device.

FIG. 1 is a conceptional diagram illustrating the interleaver/deinterleaver. Referring to FIG. 1, the interleaver includes "K" rows (K=12) and an unit cell 10 is a memory having "I" addresses in the direction of row. The first row of the interleaver includes a "0" unit cell, the second row a "1" unit cell and the last row "11" unit cells. That is, a K-th row includes "K-1" unit cells (in FIG. 1, K=12). For decoding interleaved data in the above-mentioned interleaver, the deinterleaver also includes "K" rows. The first row of the deinterleaver includes "K-1" unit cells, the second row "K-2" unit cells and a last row "zero" unit cell. Accordingly, the deinterleaved data has the same order as the data before interleaving because each row has the same delay time. And, in case of interleaving and deinterleaving, the data is transmitted with some delay among adjacent data during communication.

The above-mentioned interleaver/deinterleaver is implemented with memory. FIG. 2 is a block diagram illustrating a conventional memory address generator in the interleaver/deinterleaver. Referring to FIG. 2, the conventional memory address generator includes a plurality of counters generating a memory address for each row and a multiplexer for selecting one of the memory addresses outputted from the counters in response to a pointer. The counter in each row outputs and generates the memory address respectively. The multiplexer receives the memory address outputted from each counter and selects one of the memory addresses in response to the pointer. Namely, the selected memory address is the memory address of the convolutional interleaver/deinterleaver.

The above-mentioned memory address generator in the conventional interleaver/deinterleaver is in need of a multiplexer with multi-input and a large number of counters for generating the memory address of each row. Accordingly, the above-mentioned memory address generator has a large number of gates due to a large number of counters and a long critical path caused by the multiplexer.

SUMMARY OF THE INVENTION

It is, therefore, an object of the present invention to provide a memory address generator capable of reducing a chip size and a critical path in a convolutional interleaver/deinterleaver.

In accordance with the present invention, there is disclosed a memory address generator comprising: a first counting means for counting a first variable (y) representing a location of one of total rows in a memory of the convolutional interleaver/deinterleaver, in response to a clock signal; a second counting means for counting a second variable (z) representing a location of one of total columns in the memory of the convolutional interleaver/deinterleaver; a third counting means for counting a third variable (x) representing a location of the memory address in an unit memory cell having a plurality of a memory address; an offset value generation means for generating an offset value of the first variable in response to the first variable; a first adding means for adding the second variable outputted from the second counting means to the third variable outputted from the third counting means; and a second adding means for adding the added value from the first adding means to the offset value of the first variable outputted from the offset value generation means and outputting the memory address of the convolutional interleaver/deinterleaver.

BRIEF DESCRIPTION OF THE DRAWINGS

Other objects and aspects of the invention will become apparent from the following description of the embodiments with reference to the accompanying drawings, in which:

FIG. 5 is a schematic diagram illustrating an offset(y) in accordance with y value; and FIG. 6 is a schematic diagram illustrating the address generation according to the present invention.

DETAILED DESCRIPTION OF THE PREFERRED EMBODIMENTS

Hereinafter, the present invention will be described in detail referring to the accompanying drawings. And, as a structure of a memory address generator in an interleaver is similar to that in a deinterleaver, the following description of the preferred embodiments according to the present invention are limited to the deinterleaver.

Figure 1:
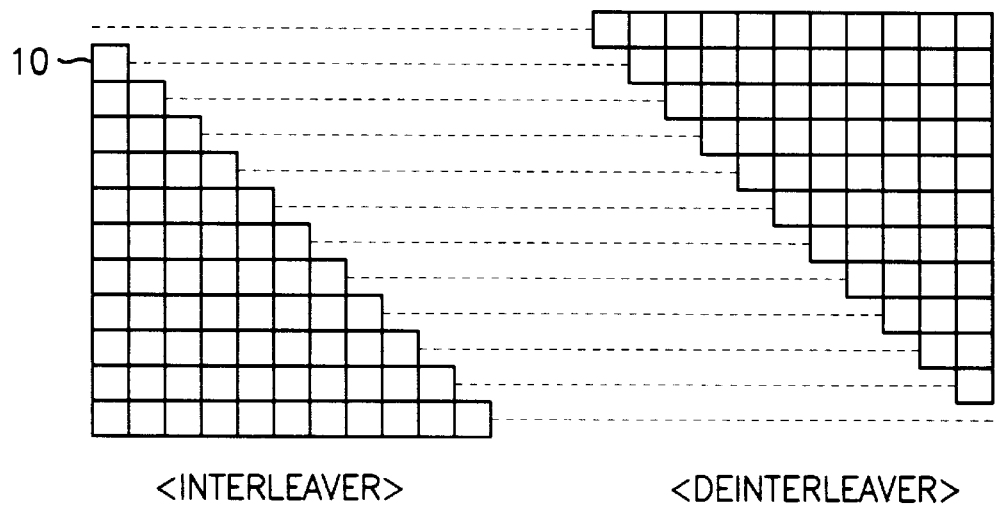
FIG. 1 is a conceptional diagram illustrating an interleaver/deinterleaver.
Figure 2:
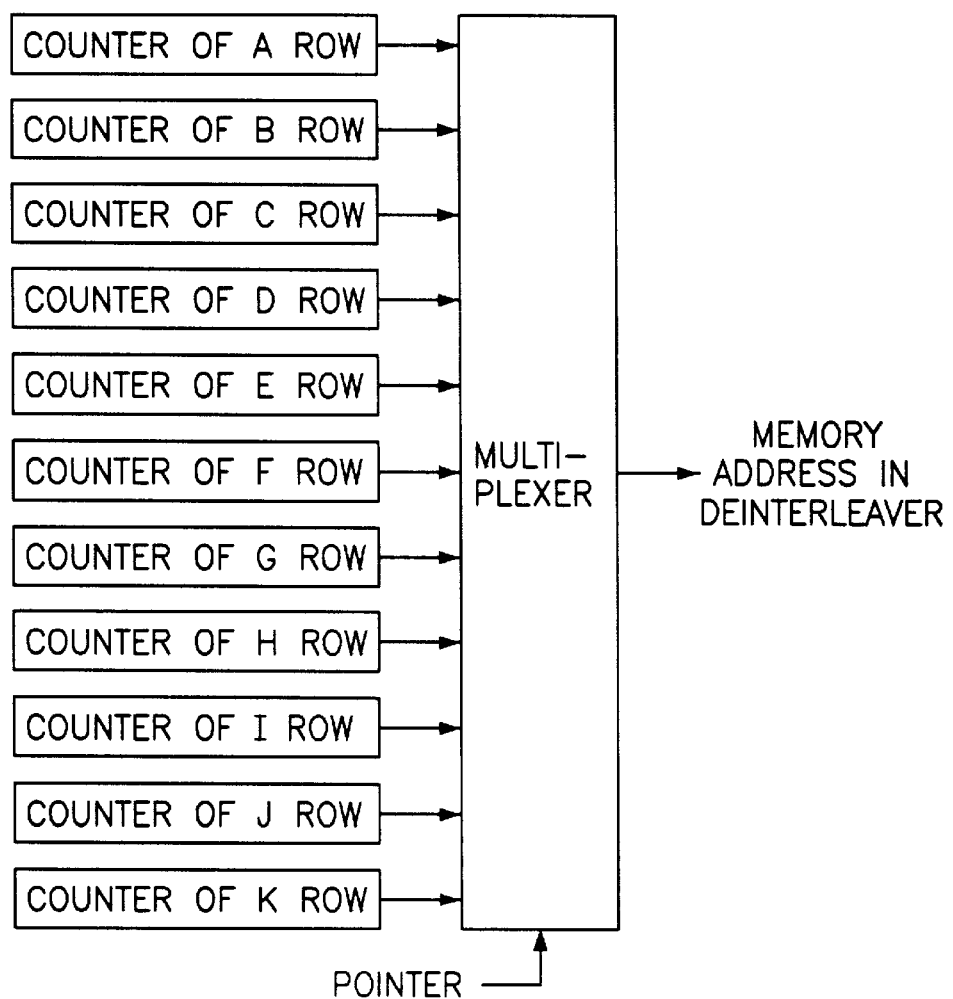
FIG. 2 is a block diagram illustrating an conventional apparatus for generating a memory address in the interleaver/deinterleaver.
Figure 3:
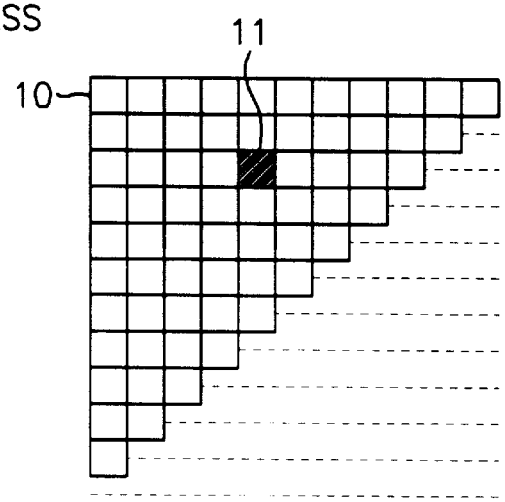
FIG. 3 is a schematic diagram illustrating a memory address map of the deinterleaver according to the present invention.

FIG. 3 is a schematic diagram illustrating a memory address map of the deinterleaver according to the present invention.

Referring to FIG. 3, I is defined as "17" and K is defined as "12" in the memory address map of the deinterleaver. The memory address is defined as variables x, y and z for generating the memory address in every cycle. The variable y is defined as a represention of location of one of "12" rows and is a value repeated and rotated from "0" to "11" in every cycle. Namely, the y value of a row A is "0", that of a row B is "1" and that of a row L is "11". Also, the variable x is defined as a represention of location of the memory address in unit cell 10 having "17" addresses in the direction of row. That is, the variable is able to have a value between "0" and "16". And, each row has the different number of the unit cell from "0" to "11" respectively, the variable z is defined as a represention of location of one of total columns. Namely, the z value of the row A is a value between "0" and "11" that of the row B is a value between "0" and "10", that of the row K is a value between "0" and "1" and that of the row L is always "0". Accordingly, the z value is dependent on the y value. The present invention generates the memory address of the deinterleaver using the above x, y and z values.

Referring to FIG. 3, a pointer in the memory address map of the deinterleaver indexes A, B, C, . . . , J, K, L (the y value) in order and repeatedly. That is, firstly with such an order (A, B, C, . . . , J, K, L) as the first memory address of the first unit cell 25 in the row A, the first memory address of the first unit cell in the row B, the first memory address of the first unit cell in the row C, the pointer indexes a memory address. Next, with such an order (A, B, C, . . . , J, K, L) as the second memory address of the first unit cell in the row A, the second memory address of the first unit cell in the row B, the second memory address of the first unit cell in the row C, the pointer indexes a memory address. Repeatedly, the memory address is indexed in the same order. After the last memory address in the row K is indexed and read, the first memory address of the second unit cell in the row A is indexed, and repeatedly in the same order. And, after a last memory address of a last unit cell in the row A is indexed and read, the first memory address of the first unit cell in the row A is indexed again, and is repeatedly indexed in the above order.

Accordingly, the deinterleaver may have the memory address indexed by the above order.

For generating the memory address of the deinterleaver, the present invention generates an offset value from the y value of each row and a base address and the offset value is added to the x value for generating each memory address. Because the memory address of each row is increased by a constant length (in the present invention, "17"), the location of the memory address in the present each unit cell is represented as x-axis and the location of each unit cell in the row is represented as z-axis.

Accordingly, the present invention has the following equation for generating a memory address.

$$address = offset(y) + x + 17 \times z$$

$$offset(y) = (12-y) \times 17 + offset(y-1), \; offset(0) = 0$$

That is, the y value is repeated and rotated from "0" to "11", and whenever the y value is rotated one time, the x value is increased by "1". At this time, an initial value of the x value is "0" and the x value is "0" followed after "16". The z value is independently increased by "1" when the x value of each row is rotated from "16" to "0", and returned to "0" after a maximum value. Also, the row L is bypassed with no delay. Accordingly, the memory address of the row L doesn't care but must not be written to the memory.

Figure 4:
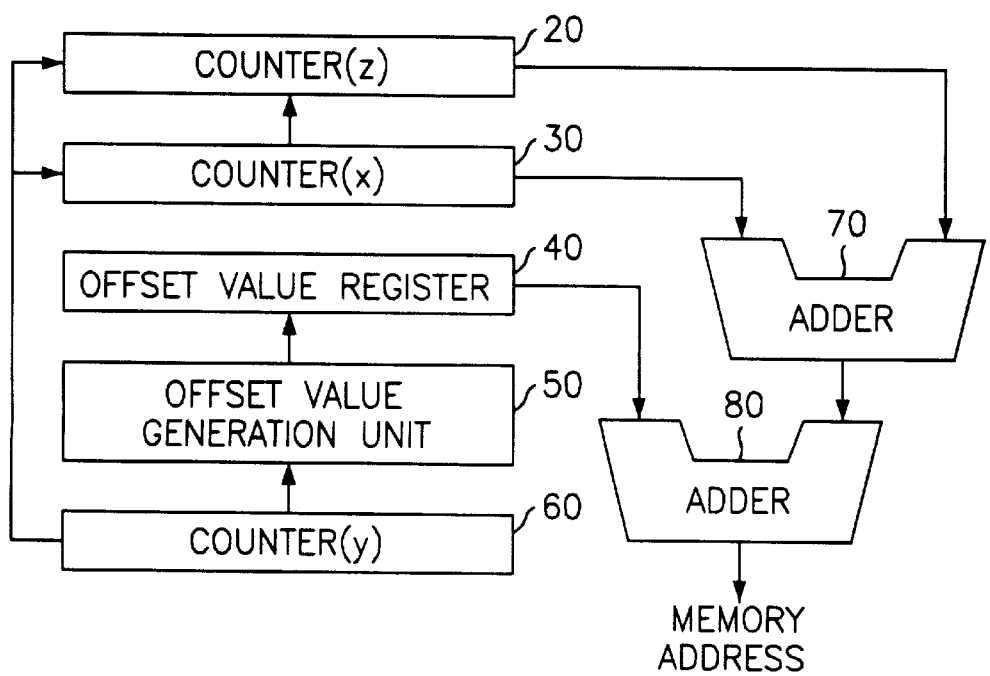
FIG. 4 is a block diagram illustrating an apparatus for generating a memory address in the deinterleaver according to the present invention.

FIG. 4 is a block diagram illustrating a memory address generator in the deinterleaver according to the present invention. The memory address generator includes a plurality of counter 20, 30 and 60, an offset value register 40, an offset value generation unit 50, two adder 70 and 80. The counter 60 counts the variable y in response to a clock signal and the counter 20 and the counter 30 count the variables z and x in response to the y value outputted from the counter 60, respectively. The x value is outputted to the counter 20, the y value to the counters 20 and 30 and the offset value generation unit 50, in response to the pointer, respectively. Also, the z value is outputted to the adder 70 in response to the pointer. Specially, the z value is increased by "17" for counting. The offset value generation unit 50 receives the y value outputted from the counter 60 and generates the offset value of the y value (offset(y)). The offset value register 40 stores the offset(y) outputted from the offset value generation unit 50. The adder 70 adds the z value outputted from the counter 20 to the x value outputted from the counter 30. The adder 80 adds the offset(y) outputted from the offset value register 40 to the added value outputted from the adder 70 and outputs the memory address of the interleaver or the deinterleaver. Referring to FIG. 4, the offset(y) and the x value are contolled by the y value and the z value is counted in response to the y value and the x value. For example, in case of generating a fourth memory address of a fifth unit cell 11 (FIG. 3) in the row C, most of all, z=4, x=3 and y=2 are outputted from the counters 20, 30 and 40 by the pointer respectively. And, the offset value generation unit 50 generates the offset(2) based on the above equation and outputs the offset(2)="357", Accordingly, the memory address is outputted as "428" through two adders 70 and 80.

FIG. 5 is illustrating the offset(y) in accordance with the y value for generating the memory address, and FIG. 6 is illustrating the x, y and z values, the offset(y) and the memory address according to the present invention. Referring to FIG. 5 and FIG. 6, in case that x=15, z=1 and offset(y)=187, the memory address of the deinterleaver is "203". The present invention described as above makes it possible effectively to reduce a chip size.

That is, Table 1 describes the number of gates in the conventional memory address generator and the present invention, using a logic synthesis tool of SYNOPSYS Co. under the same condition. As the following Table 1 is shown, the present invention is implemented as the smaller number of gate counts than the conventional memory address generator. An unit of the Table 1 is the number of NAND gate.

TABLE 1

| | gate counts (the conventional address generator) | gate counts (the present address generator) |
| --- | --- | --- |
| storage device | 719 | 427 |
| non-storage device | 1069 | 472 |
| total | 1788 | 899 |

Additionally, the present invention reduces a critical path because a multiplexer with multi-input is not necessary in this invention.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A memory address generator in a convolutional interleaver/deinterleaver for correcting errors occurred in a data transmission of communication systems, comprising:

a first counting means for counting a first variable (y) representing a location of one of total rows in a memory of the convolutional interleaver/deinterleaver, in response to a clock signal;

a second counting means for counting a second variable (z) representing a location of one of total columns in the memory of the convolutional interleaver/deinterleaver;

a third counting means for counting a third variable (x) representing a location of the memory address in an unit memory cell having a plurality of a memory address;

an offset value generation means for generating an offset value of the first variable in response to the first variable;

a first adding means for adding the second variable outputted from the second counting means to the third variable outputted from the third counting means; and a second adding means for adding the added value from the first adding means to the offset value of the first variable outputted from the offset value generation means and outputting the memory address of the convolutional interleaver/deinterleaver.

2. The memory address generator according to claim 1, wherein the second counting means increases the second variable by the number of the memory address in the unit memory cell.

3. The memory address generator according to claim 1, wherein the offset value generation means comprises:

a subtracting means for subtracting the first variable (y) from (the number of the total columns in the memory+1);

a multiplying means for multiplying the subtracted value by the number of the memory address included in the unit memory cell; and a third adding means for adding the offset value of (the first variable−1) to the multiplied value and outputting the offset value of the first variable.

4. The memory address generator according to claim 1, wherein the second counting means and the third counting means count the second variable (z) and the third variable (x) in response to the first variable (y) outputted from the first counting means respectively.

5. The memory address generator according to claim 4, wherein the second counting means counts the second variable in response to the third variable outputted from the third counting means.

* * * * *